(12) United States Patent
Tsunekawa (10) Patent No.: US 7,678,608 B2
(45) Date of Patent: Mar. 16, 2010

(54) PROCESS FOR PRODUCING WIRING CIRCUIT BOARD

(75) Inventor: Makoto Tsunekawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/541,553

(22) Filed: Oct. 3, 2006

(65) Prior Publication Data
US 2007/0077758 A1  Apr. 5, 2007

(30) Foreign Application Priority Data
Oct. 3, 2005 (JP) .................. P. 2005-290169

(51) Int. Cl.
*H01L 21/44* (2006.01)
(52) U.S. Cl. .................. 438/106; 438/117; 438/149; 257/687; 257/E21.516
(58) Field of Classification Search ........... 438/106, 438/117, 127, 149; 257/687, E21.516
See application file for complete search history.

(56) References Cited

U.S. PATENT DOCUMENTS 5,874,009 A * 2/1999 Inada et al. .................. 216/20

| | | | |
|---|---|---|---|
| 2004/0161626 A1 * | 8/2004 | Kwon et al. | 428/577 |
| 2004/0256239 A1 * | 12/2004 | Whitlaw et al. | 205/118 |
| 2005/0244620 A1 * | 11/2005 | Tsunekawa et al. | 428/209 |
| 2006/0011374 A1 * | 1/2006 | Sakamoto | 174/117 F |
| 2007/0145584 A1 * | 6/2007 | Kataoka et al. | 257/736 |

FOREIGN PATENT DOCUMENTS

JP  2002-124547 A  4/2002

* cited by examiner

*Primary Examiner*—Hsien-ming Lee
(74) *Attorney, Agent, or Firm*—Sughrue Mion, PLLC (57) ABSTRACT

The present invention provides a process for producing a wiring circuit board which can be inhibited from developing whiskers and can be reduced in the unevenness of connectivity with electronic parts while retaining the connectivity. According to the present invention, a wiring pattern 12 comprising a thin metal film 31 and a conductor layer 33 is formed on a base insulating layer BIL. A tin-plated layer 34 is formed by electroless plating so as to coat the wiring pattern 12 therewith. The wiring pattern 12 and the tin-plated layer 34 are then subjected to a heat treatment. The heat treatment temperature and heat treatment period are regulated to 175 to 225° C. and 2 to 10 minutes, respectively. By the heat treatment, a mixture layer 35 comprising copper and tin is formed. Thereafter, a solder resist SOL is formed over the base insulating layer so as to cover the wiring pattern 12 and tin-plated layer 34 in given regions. Subsequently, the solder resist SOL is subjected to a heat curing treatment.

6 Claims, 7 Drawing Sheets

PROCESS FOR PRODUCING WIRING CIRCUIT BOARD

FIELD OF THE INVENTION

The present invention relates to a process for producing a wiring circuit board.

BACKGROUND OF THE INVENTION

Wiring circuit boards such as TAB (tape automated bonding) tape carrier generally contain a substrate containing an insulating layer and, formed thereon, a wiring pattern containing a conductor layer, and are used in various electronic appliances.

Various electronic parts are mounted on a wiring circuit board and connected to terminal parts of the wiring pattern. The terminals of the electronic parts are made of, e.g., gold. In this case, in order to improve the connectivity of the terminal parts of the wiring pattern with the terminals of such electronic parts, a tin film (tin deposit) is formed so as to coat the terminal parts of the wiring pattern therewith. Herein, the term "connectivity of wiring pattern with electronic part" means the certainty of electrical and physical connection between the wiring pattern and the electronic part. However, there are cases where whiskery crystals called whiskers grow on the tin film on the terminal parts. These whiskers may cause short-circuiting in the wiring pattern.

Patent document 1 discloses that it is possible to inhibit the generation of whiskers for a long period of time by forming a tin-plated layer on a wiring pattern made of copper, followed by subjecting the deposit layer to a heat treatment at 80 to 140° C. However, it is pointed out in patent document 1 that heating at the temperature higher than 140° C. causes a problem, for example, that the tin-plated layer discolors.

Patent document 1: JP-A-2002-124547

SUMMARY OF THE INVENTION

After conducting the heat treatment by the above-described method, a solder resist layer is formed so as to coat the wiring pattern, whereby a wiring circuit board is completed. However, in the wiring circuit board produced by the above-described method, the unevenness of connectivity with electronic parts becomes high. Herein, the term "unevenness of connectivity" means the unevenness of certainty of electrical and physical connection between the wiring pattern and electronic parts. In this case, the wiring circuit board having low connectivity is treated as a defective. This results in considerable fluctuations in product yield.

An object of the present invention is to provide a process for producing a wiring circuit board by which the generation of whiskers can be inhibited and the unevenness of connectivity with electronic parts can be reduced while retaining the connectivity.

The present inventor made various experiments and investigations. As a result, it is found that the mixture layer of copper and tin formed by the heat treatment unnecessarily grows during the heat curing treatment for solder resist formation and this causes the unevenness of connectivity of the wiring pattern with electronic parts. In general, a higher heat treatment temperature results in a larger thickness of the mixture layer and a smaller thickness of the tin film. As a result, the connectivity of the wiring pattern with electronic parts becomes worse. Therefore, the heat treatment has been conventionally conducted at a low temperature not higher than 140° C. However, as a result of the experiments and investigations made by the inventor, it is found that the connectivity of a wiring pattern with electronic parts can be secured and the unevenness of connectivity can be inhibited, by conducting the heat treatment at a temperature regulated so as to be in a specific range higher than that in a conventional method. Accordingly, the inventor has achieved the present invention, which is as follows.

(1) The present invention provides a process for producing a wiring circuit board, which comprises:

forming a conductor pattern comprising copper on an insulating layer;

forming a tin film coating the conductor pattern;

subjecting the conductor pattern and the tin film to a first heat treatment after the tin film formation;

forming a coating layer on the insulating layer, said coating layer coating given areas of the conductor pattern and the tin film; and subjecting the coating layer to a second heat treatment, wherein said first heat treatment on the conductor pattern and the tin film is conducted at a temperature of from 175 to 225° C. for 2 to 10 minutes.

According to the process of the present invention for producing a wiring circuit board, a conductor pattern comprising at least copper is formed on an insulating layer. Subsequently, a tin film is formed so as to coat the conductor pattern therewith. Next, the conductor pattern and the tin film are subjected to a heat treatment (first heat treatment). In this heat treatment, the temperature is regulated so as to be 175 to 225° C. and the time period of the treatment is regulated so as to be 2 to 10 minutes. Subsequently, a coating layer is formed over the insulating layer so as to coat given areas of the conductor pattern and tin film therewith. Then, the coating layer is subjected to a heat treatment (second heat treatment).

In this regard, as a result of the heat treatment on the conductor pattern and tin film, a mixture layer containing copper and tin is formed and whisker generation can be inhibited.

In the course of the heat treatment on the coating layer, the thickness of the mixture layer increases. When the increase in mixture layer thickness is large, the unevenness of the mixture layer thickness becomes high.

Furthermore, the increase in mixture layer thickness results in a decrease in tin film thickness. For improving the connectivity of the conductor pattern with electronic parts, the tin film should have a necessary thickness.

By regulating the temperature in the heat treatment on the conductor pattern and tin film to 175 to 225° C. and the time period of this heat treatment to 2 to 10 minutes, the tin film can be made to retain a necessary thickness after the heat treatment on the coating layer and the increase in mixture layer thickness through this heat treatment can be reduced. As a result, the unevenness of the connectivity of the conductor pattern with electronic parts can be reduced while securing the connectivity.

(2) The step of forming the coating layer may include a step in which a solder resist is formed as the coating layer on the insulating layer so as to coat given areas of the conductor pattern and the tin film, and the step of subjecting the coating layer to the heat treatment (second heat treatment) may include a step in which the solder resist is subjected to a heat curing treatment.

In this case, after the heat treatment on the conductor pattern and tin film, a solder resist is formed on the insulating layer so as to coat given areas of the conductor pattern and the tin film. Subsequently, a heat curing treatment of the solder resist is conducted.

By regulating the temperature in the heat treatment on the conductor pattern and tin film to 175 to 225° C. and the time period of this heat treatment to 2 to 10 minutes, the tin film can be made to retain a necessary thickness after the heat curing treatment of the solder resist and the increase in mixture layer thickness through this heat curing treatment can be reduced. As a result, the unevenness of the connectivity of the conductor pattern with electronic parts can be reduced while securing the connectivity.

(3) The temperature in the heat curing treatment on the solder resist may be 80 to 160° C. In this case, the tin film can retain a necessary thickness without fail after the heat curing treatment on the solder resist and the increase in mixture layer thickness through this heat curing treatment can be sufficiently reduced. As a result, the unevenness of the connectivity of the conductor pattern with electronic parts can be sufficiently reduced while securing the connectivity without fail.

According to the present invention, the temperature in the heat treatment on the conductor pattern and tin film is regulated to 175 to 225° C. and the time period of this heat treatment is regulated to 2 to 10 minutes. Thus, the tin film can retain a necessary thickness after the heat treatment on the coating layer and the increase in mixture layer thickness through this heat treatment can be reduced. As a result, the unevenness of the connectivity of the conductor pattern for with electronic parts can be reduced while securing the connectivity.

DESCRIPTION OF REFERENCE NUMERALS AND SIGNS

1 TAB tape carrier
1S is sprocket hole
11 mounting part
12 wiring pattern
20 outer lead part
21 mounting region
22 inner lead part
30 long sheet substrate
31 thin metal film
32 plating resist
33 conductor layer
34 tin-plated layer formed by electroless plating
35 mixture layer
41 conductor layer
42 etching resist
BIL base insulating layer
SL slitting line
SOL solder resist

DETAILED DESCRIPTION OF THE INVENTION

One of the embodiments of the process for producing wiring circuit board according to the present invention will be explained below by reference to the drawings. In this embodiment, TAB (tape automated bonding) tape carriers are produced as wiring circuit boards.

(1) Basic Constitution of TAB Tape Carrier

Figure 1:
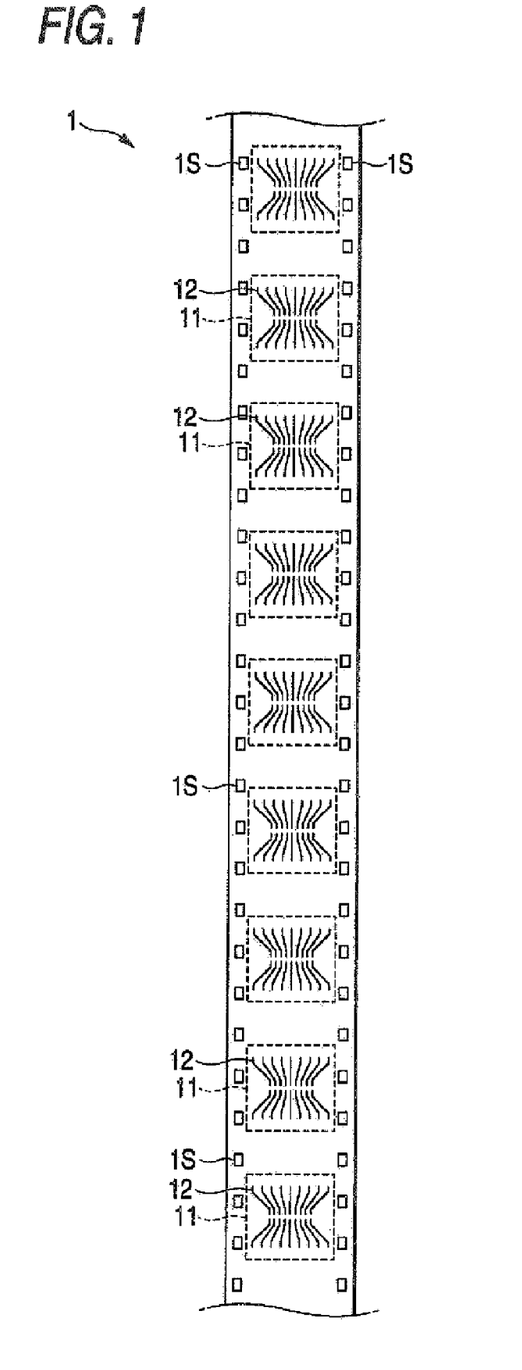
FIG. 1 is a plan view of a TAB tape carrier according to one embodiment of the present invention.

FIG. 1 is a plan view of a TAB tape carrier to be produced by the embodiment of the process according to the present invention. As shown in FIG. 1, the long sheet TAB tape carrier 1 has mounting parts 11 for mounting electronic parts, e.g., semiconductor chips. These mounting parts 11 are arranged in the lengthwise direction for the TAB tape carrier 1 so as to be spaced from each other at a given distance.

In each of edge parts respectively on both sides of the TAB tape carrier 1, square sprocket hole 1S is formed at a given interval so as to extend in the lengthwise direction for the TAB tape carrier 1. In each mounting part 11, a wiring pattern 12 for bonding the electrodes of electronic parts and the like is formed.

The wiring pattern 12 may be formed by exposing a resist film to light, developing the film, and subjecting the film to given treatments (details will be explained later).

(2) Constitution of Mounting Parts

The mounting parts 11 will be explained below in more detail.

Figure 2:
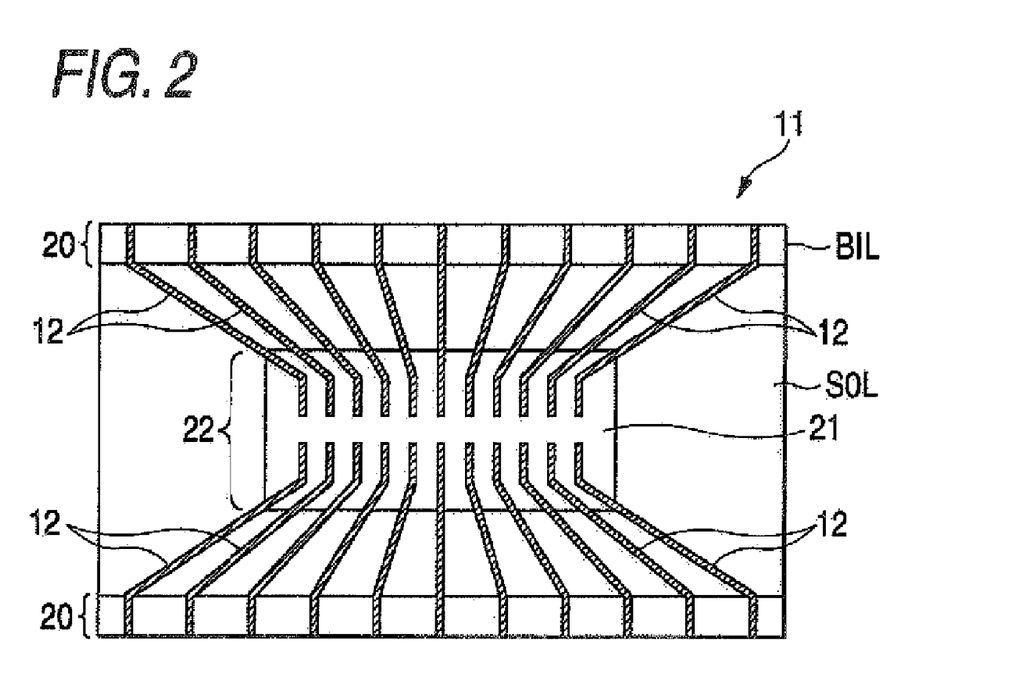
FIG. 2 is a plan view illustrating a mounting part.
Figure 3:
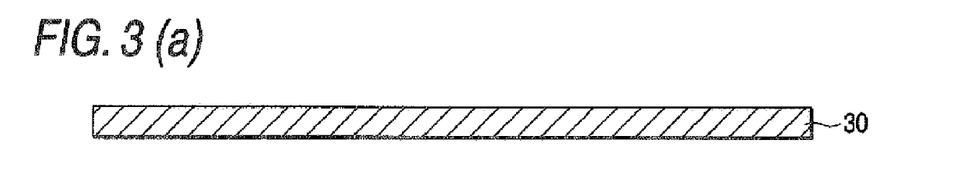
FIGS. 3(a) to 3(d) are views of production steps for illustrating a process for producing tape carriers for TAB by the semi-additive method.
Figure 4:
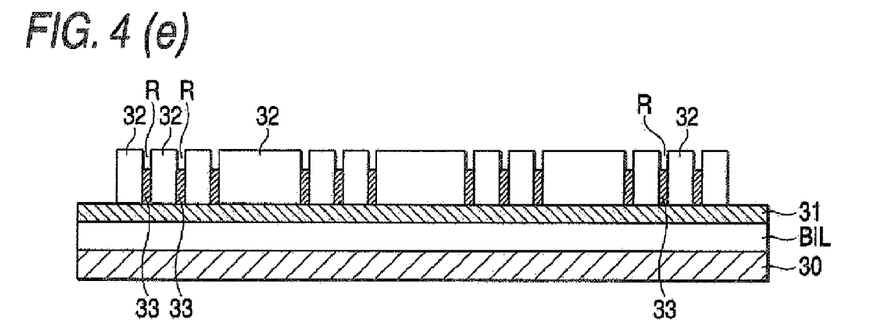
FIGS. 4(e) to 4(h) are views of production steps for illustrating the process for producing tape carriers for TAB by the semi-additive method.

FIG. 2 is a plan view illustrating the mounting part 11. As shown in FIG. 2, multiple wiring patterns 12 are formed on a base insulating layer BIL. The multiple wiring patterns 12 include those extending from a central part of the base insulating layer BIL toward one side part and those extending from the central part of the base insulating layer BIL toward another side part.

A solder resist SOL is disposed so as to cover the region other than the one side part and the other side part. The region in which ends of the respective wiring patterns 12 are not covered with the solder resist SOL is referred to as outer lead part 20.

In the central part of the base insulating layer BIL, electronic parts (not shown in Figs.) such as semiconductor chips are mounted on the ends of the respective wiring patterns 12. This region in which electronic parts are mounted is shown as a mounting region 21. The part in which the respective wiring patterns 12 are located in the mounting region 21 is referred to as an inner lead part 22. The inner lead part 22 is not covered with the solder resist SOL.

(3) Production of TAB Tape Carrier

A process for producing TAB tape carrier 1 is explained below separately with respect to the case of using the semi-additive method and the case of using the subtractive method. In this process, four TAB tape carriers 1 are simultaneously formed and are separated from one another in the final step, whereby TAB tape carriers 1 in the form shown in FIG. 1 are obtained. Details thereof are explained below.

(a) Production by Semi-Additive Method

FIGS. 3(a) to 6(l) are views illustrating production steps in a process for producing TAB tape carrier 1 by the semi-additive method.

First, a long sheet substrate 30 is prepared as shown in FIG. 3(a). As the long sheet substrate 30, for example, a metal sheet such as stainless-steel sheet, copper sheet, or nickel sheet can be used.

Subsequently, a base insulating layer BIL is formed on the long sheet substrate 30 as shown in FIG. 3(b). The base insulating layer BIL is made of, e.g., a resin such as polyimide or polyester.

A thin metal film 31 is then formed on the base insulating layer BIL by sputtering as shown in FIG. 3(c).

Thereafter, a plating resist 32 having a given pattern with groove parts R is formed on the thin metal film 31 as shown in FIG. 3(d). The plating resist 32 may be formed, for example, by forming a resist film on the thin metal film 31 by, e.g., a dry film resist; exposing the resist film to light according to a given pattern; and then developing the resist film.

Subsequently, as shown in FIG. 4(e), a conductor layer 33 is formed in the groove parts R disposed on the thin metal film 31 by electroplating. As the thin metal film 31 and the conductor layer 33, a metallic material containing at least copper, such as copper or a copper alloy can be used. Although the thin metal film 31 and the conductor layer 33 may be made of different materials, it is preferable to use the same material. In the following explanation on this embodiment, copper is used as the thin metal film 31 and conductor layer 33.

The plating resist 32 is then removed by chemical etching (wet etching) or by stripping as shown in FIG. 4(f). Thereafter, the exposed areas of the thin metal film 31 are removed by etching as shown in FIG. 4(g). As a result, wiring patterns 12 each constituted of the thin metal film 31 and conductor layer 33 (see FIGS. 1 and 2) are formed.

Figure 5I:
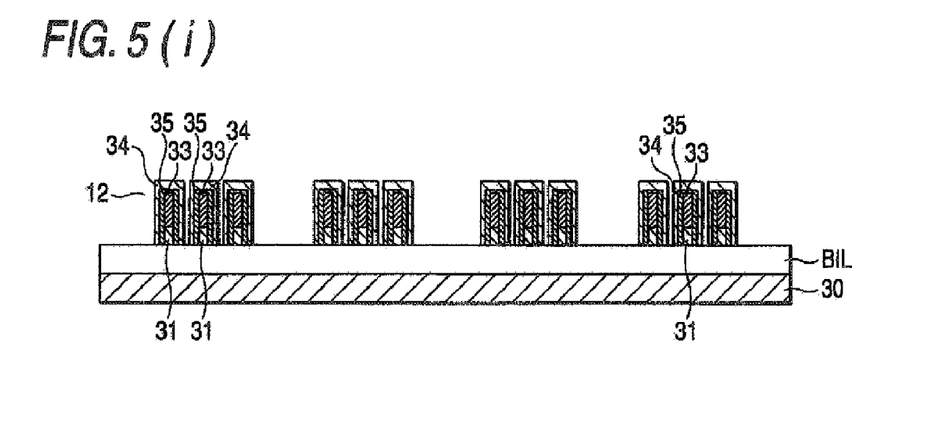
FIGS. 5(i) to 5(k) are views of production steps for illustrating the process for producing tape carriers for TAB by the semi-additive method.

Subsequently, tin-plated layer 34 is formed by electroless plating so as to coat the wiring pattern 12 as shown in FIG. 4(h). The wiring pattern 12 and the tin-plated layer 34 are subjected to a heat treatment. The temperature in this heat treatment is regulated to 175 to 225° C. and the time period of the heat treatment is regulated to 2 to 10 minutes. As a result of the heat treatment, copper, which is the material of the thin metal film 31 and conductor layer 33 constituting the wiring patterns 12, diffuses into the tin-plated layer 34. As a result, mixture layer 35 containing copper and tin is formed as shown in FIG. 5(i).

When the thickness of the mixture layer 35 is 0.2 μm or larger, whisker generation can be sufficiently inhibited. When the thickness of the mixture layer 35 is 0.45 μm or smaller, the tin-plated layer 34 can have a thickness necessary for improving, without fail, the connectivity of the wiring pattern 12 with an electronic part. Consequently, the thickness of the mixture layer 35 is preferably from 0.2 to 0.45 μm.

Furthermore, when the thickness of the mixture layer 35 is 0.25 μm or larger, whisker generation can be more sufficiently inhibited. When the thickness of the mixture layer 35 is 0.4 μm or smaller, the tin-plated layer 34 can have a thickness necessary for improving, with higher certainty, the connectivity of the wiring patterns 12 with an electronic part. Consequently, the thickness of the mixture layer 35 is more preferably form 0.25 to 0.4 μm.

Figure 5J:
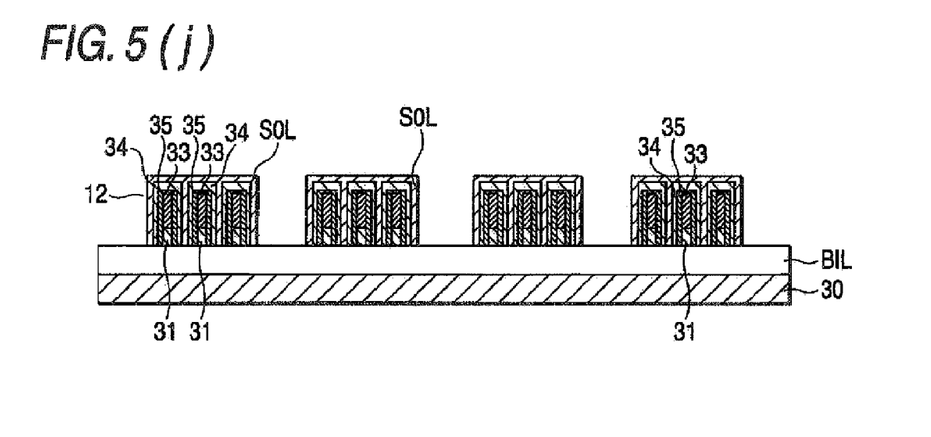

Thereafter, a solder resist SOL is formed by, e.g., screen printing so as to cover the wiring pattern 12 and the tin-plated layer 34 in a given region in the mounting part 11 (see FIGS. 1 and 2) as shown in FIG. 5(j). This solder resist SOL is subjected to a heat curing treatment. The temperature in this heat curing treatment is preferably from 80 to 160° C., more preferably from 110 to 130° C.

Figure 5K:
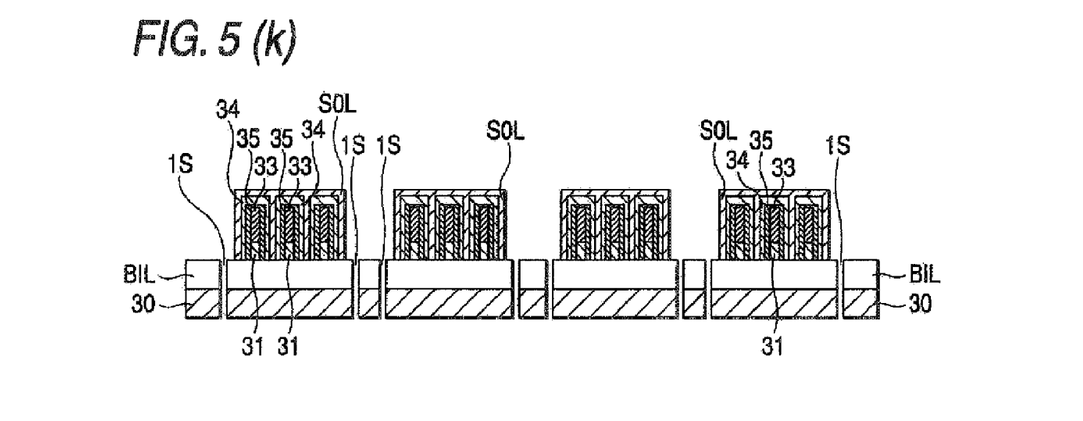
Figure 6:
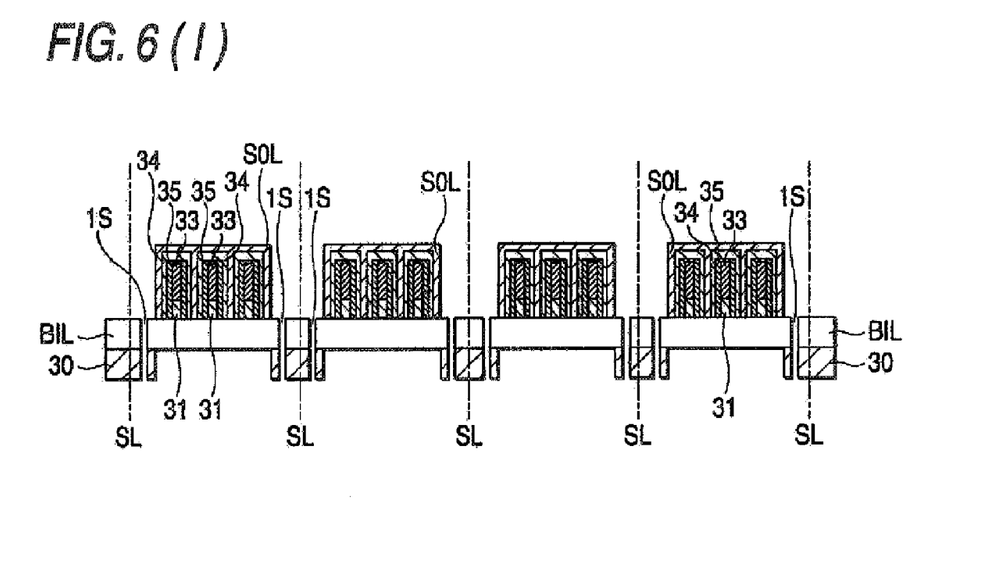
FIG. 6(l) is a view of a production step for illustrating the process for producing tape carriers for TAB by the semi-additive method.

Subsequently, as shown in FIG. 5(k), sprocket holes 1 is formed in each of edge parts respectively on both sides of the mounting part 11 (see FIGS. 1 and 2). Thereafter, those areas of the long sheet substrate 30 which are located under the mounting part 11 are removed by etching as shown in FIG. 6(l).

Finally, the resultant long sheet structure is slit along the slitting lines SL shown in FIG. 6(l) and thereby separated into four TAB tape carriers 1. Thus, TAB tape carriers 1 as shown in FIGS. 1 and 2 are completed.

(b) Production by Subtractive Method

Next, a process for producing TAB tape carrier 1 by the subtractive method is explained below.

First, a base insulating layer BIL and a thin metal film 31 are formed on a long sheet substrate 30 in the same manners as in FIGS. 3(a) to 3(c).

Figure 7:
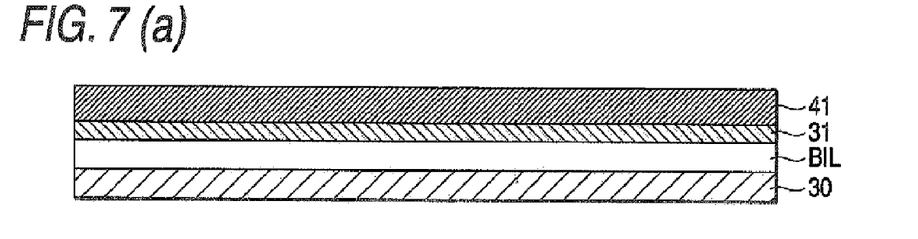
FIGS. 7(a) to 7(d) are views of production steps for illustrating a process for producing tape carriers for TAB by the subtractive method.

Subsequently, a conductor layer 41 is formed on the thin metal film 31 as shown in FIG. 7(a). For example, copper can be used as the conductor layer 41.

Next, an etching resist 42 having a given pattern is formed on the conductor layer 41 as shown in FIG. 7(b). The etching 42 is formed, for example, by forming a resist film on the conductor layer 41 by, e.g., a dry film resist; exposing the resist film to light according to a given pattern; and then developing the resist film.

Subsequently, those areas of the thin metal film 31 and conductor layer 41 which are not located under the etching resist 42 are removed by etching as shown in FIG. 7(c). The etching resist 42 is then removed with a stripping liquid as shown in FIG. 7(d). As a result, wiring pattern 12 composed of the thin metal film 31 and the conductor layer 41 (see FIGS. 1 and 2) is formed.

Thereafter, the resultant long sheet structure is processed by the steps illustrated in FIG. 4(h) to FIG. 6(l), whereby TAB tape carriers 1 are completed.

(4) Advantages of This Embodiment

In this embodiment, the wiring pattern 12 and the tin-plated layer 34 are subjected to a heat treatment. As a result, the mixture layer 35 containing copper and tin is formed and whisker generation can be inhibited.

The thickness of the mixture layer 35 increases in the course of the heat curing treatment of the solder resist SOL. When the increase in the thickness of the mixture layer 35 is large, the unevenness of the thickness of the mixture layer 35 becomes high.

Further, the increase in the thickness of the mixture layer results in a decrease in the thickness of the tin-plated layer 34. For improving the connectivity of the wiring pattern 12 with electronic parts, the tin-plated layer 34 should have a necessary thickness. Although the necessary thickness of the tin-plated layer 34 varies, depending on the wiring pitch, it is usually in the range of from 0.1 to 0.3 μm.

In this embodiment, by regulating the temperature in the heat treatment on the wiring pattern 12 and tin-plated layer 34 to 175 to 225° C. and the time period of the heat treatment to 2 to 10 minutes, the tin-plated layer 34 can retain a necessary thickness after the heat curing treatment on the solder resist SOL and the increase in the thickness of the mixture layer 35 during the heat curing treatment can be reduced. As a result, the unevenness of the connectivity of the wiring pattern 12 with electronic parts can be reduced while securing the connectivity.

In the embodiment described above, a thin metal film 31 is formed between the base insulating layer BIL and the conductor layer 33. However, when a sufficient adhesion is secured between the base insulating layer BIL and the conductor layer 33, it is not necessary to form the thin metal film 31 between the base insulating layer BIL and the conductor layer 33.

EXAMPLES

In the following Examples 1 to 4, TAB tape carriers 1 were produced by the semi-additive method used in the embodiment described above. In the following Comparative Examples 1 and 2, TAB tape carriers 1 were produced in the same manner as in Examples 1 to 4, except the heat treatment temperature and the heat treatment period.

Example 1

The heat treatment temperature was regulated to 175° C. and the heat treatment period was regulated to each of 2 minutes, 5 minutes, and 10 minutes.

Example 2

The heat treatment temperature was regulated to 185° C. and the heat treatment period was regulated to each of 2 minutes, 5 minutes, and 10 minutes.

Example 3

The heat treatment temperature was regulated to 200° C. and the heat treatment period was regulated to each of 2 minutes, 5 minutes, and 10 minutes.

Example 4

The heat treatment temperature was regulated to 225° C. and the heat treatment period was regulated to each of 2 minutes, 5 minutes, and 10 minutes.

Comparative Example 1

The heat treatment temperature was regulated to 150° C. and the heat treatment period was regulated to each of 2 minutes, 5 minutes, and 10 minutes.

Comparative Example 2

The heat treatment temperature was regulated to each of 175° C., 185° C., 200° C., and 225° C. and the heat treatment period was regulated to 15 minutes.

Evaluation

The TAB tape carriers 1 produced in Examples 1 to 4 and Comparative Examples 1 and 2 were examined for the thickness of the mixture layer 35 formed by the heat treatment, the increase in the thickness of the mixture layer 35 through the formation of the solder resist SOL, and the thickness of the mixture layer 35 after the solder resist SOL formation. The results obtained are shown in Table 1.

TABLE 1

|  | Heat treatment temperature [° C.] | Heat treatment period [min] | Mixture layer [μm] | Increase in mixture layer thickness through solder resist formation [μm] | Thickness of mixture layer after solder resist formation [μm] |
|---|---|---|---|---|---|
| Example 1 | 175 | 2 | 0.2 | 0.03 | 0.23 |
|  |  | 5 | 0.22 | 0.03 | 0.25 |
|  |  | 10 | 0.27 | 0.02 | 0.29 |
| Example 2 | 185 | 2 | 0.21 | 0.03 | 0.24 |
|  |  | 5 | 0.25 | 0.02 | 0.27 |
|  |  | 10 | 0.36 | 0.02 | 0.38 |
| Example 3 | 200 | 2 | 0.26 | 0.02 | 0.28 |
|  |  | 5 | 0.35 | 0.01 | 0.36 |
|  |  | 10 | 0.42 | 0.01 | 0.43 |
| Example 4 | 225 | 2 | 0.31 | 0.02 | 0.33 |
|  |  | 5 | 0.4 | 0.01 | 0.41 |
|  |  | 10 | 0.44 | 0.01 | 0.45 |
| Comparative Example 1 | 150 | 2 | 0.09 | 0.09 | 0.18 |
|  |  | 5 | 0.14 | 0.08 | 0.22 |
|  |  | 10 | 0.19 | 0.07 | 0.26 |
| Comparative Example 2 | 175 | 15 | 0.37 | 0.02 | 0.39 |
|  | 185 |  | 0.47 | 0.01 | 0.48 |
|  | 200 |  | 0.51 | 0.01 | 0.52 |
|  | 225 |  | 0.54 | 0.01 | 0.55 |

As shown in Table 1, the increases in the thickness of the mixture layers 35 through the solder resist SOL formation in Examples 1 to 4 were 0.01 to 0.03 μm.

In contrast, in Comparative Example 1, the increases in the thickness of the mixture layers 35 through the solder resist SOL formation were 0.07 to 0.09 μm, which were larger than those in Examples 1 to 4.

Further, in the case that the heat treatment temperature was 175° C., when the heat treatment periods were 2 to 10 minutes as in Example 1, then each thickness of the mixture layers 35 after the solder resist SOL formation was as small as 0.23 to 0.29 μm. In contrast, when the heat treatment period was 15 minutes as in Comparative Example 2, the thickness of the mixture layer 35 after the solder resist SOL formation was as large as 0.39 μm.

In the case that the heat treatment temperature was 185° C., and when the heat treatment periods were 2 to 10 minutes as in Example 2, then each thickness of the mixture layers 35 after the solder resist SOL formation was as small as 0.24 to 0.38 μm. In contrast, when the heat treatment period was 15 minutes as in Comparative Example 2, the thickness of the mixture layer 35 after the solder resist SOL formation was as large as 0.48 μm.

In the case that the heat treatment temperature was 200° C., and when the heat treatment periods were 2 to 10 minutes as in Example 3, then each thickness of the mixture layers 35 after the solder resist SOL formation was as small as 0.28 to 0.43 μm. In contrast, when the heat treatment period was 15 minutes as in Comparative Example 2, the thickness of the mixture layer 35 after the solder resist SOL formation was as large as 0.52 μm.

In the case that the heat treatment temperature was 225° C., and when the heat treatment periods were 2 to 10 minutes as in Example 4, then each thickness of the mixture layers 35 after the solder resist SOL formation was as small as 0.33 to 0.45 μm. In contrast, when the heat treatment period was 15 minutes as in Comparative Example 2, the thickness of the mixture layer 35 after the solder resist SOL formation was as large as 0.55 μm.

For improving the connectivity of the wiring pattern 12 with electronic parts, it is necessary that the thickness of the mixture layer 35 after the solder resist SOL formation should not be excessively large and the tin-plated layer 34 should retain a necessary thickness.

It is found from a comparison between Examples 1 to 4 and Comparative Example 2 that the heat treatment period is preferably 2 to 10 minutes.

It is found from those results that by regulating the heat treatment temperature to 175 to 225° C. and the heat treatment period to 2 to 10 minutes, the increase in the thickness of the mixture layer 35 can be reduced and the tin-plated layer 34 can be made to retain a thickness necessary for improving the connectivity of the wiring pattern 12 with electronic parts.

In this regard, the base insulating layer BIL, wiring pattern 12, tin-plated layer 34, and solder resist SOL in the embodiment described above correspond to the insulating layer, conductor pattern, tin film, and coating layer according to the present invention, respectively.

While the present invention has been described in detail and with reference to specific embodiments thereof, it will be apparent to one skilled in the art that various changes and modifications can be made therein without departing from the scope thereof.

This application is based on Japanese patent application No. 2005-290169 filed Oct. 3, 2005, the entire contents thereof being hereby incorporated by reference.

What is claimed is:

1. A process for producing a wiring circuit board, which comprises sequentially:
    forming a conductor pattern comprising copper on an insulating layer;
    forming a tin film coating the conductor pattern;
    subjecting the conductor pattern and the tin film to a first heat treatment after the tin film formation;
    forming a coating layer on the insulating layer, said coating layer coating given areas of the conductor pattern and the tin film; and
    subjecting the coating layer to a second heat treatment,
    wherein the first heat treatment on the conductor pattern and the tin film is conducted at a temperature of from 175 to 225° C. for 2 to 10 minutes.

2. The process for producing a wiring circuit board according to claim 1,
    wherein said step of forming the coating layer comprises forming, as the coating layer, a solder resist on the insulating layer, said solder resist coating given areas of the conductor pattern and the tin film, and
    wherein said step of subjecting the coating layer to the second heat treatment comprises subjecting the solder resist to a heat curing treatment.

3. The process for producing a wiring circuit board according to claim 2, wherein the heat curing treatment on the solder resist is conducted at a temperature of from 80 to 160° C.

4. The process for producing a wiring circuit board according to claim 1, said conductor pattern and said tin film forming a mixture layer comprising copper and tin through the first heat treatment.

5. The process for producing a wiring circuit board according to claim 4, wherein the mixture layer has a thickness of from 0.2 to 0.45 μm.

6. The process for producing a wiring circuit board according to claim 5, wherein the mixture layer has a thickness of from 0.25 to 0.4 μm.

* * * * *